(12) United States Patent
Xu

(10) Patent No.: US 8,841,145 B2
(45) Date of Patent: Sep. 23, 2014

(54) SYSTEM FOR WAFER-LEVEL PHOSPHOR DEPOSITION

(75) Inventor: Tao Xu, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/963,011

(22) Filed: Dec. 8, 2010

(65) Prior Publication Data

US 2011/0073896 A1 Mar. 31, 2011

(51) Int. Cl.
*H01L 21/00* (2006.01)
*H01L 33/50* (2010.01)

(52) U.S. Cl.
CPC ....... *H01L 33/508* (2013.01); *H01L 2933/0041* (2013.01)
USPC .................. 438/29; 438/22; 438/24; 438/33; 438/458; 257/82; 257/88; 257/98

(58) Field of Classification Search
CPC ............... H01L 33/507; H01L 33/005; H01L 2933/0041
USPC ............. 438/22–26, 28–29, 33–35, 46, 458, 438/460, 464; 257/82, 88, 98
See application file for complete search history.

(56) References Cited

U.S. PATENT DOCUMENTS

| | | | | |
|---|---|---|---|---|
| 6,656,574 | B1 * | 12/2003 | Nemelka | 428/207 |
| 7,344,952 | B2 * | 3/2008 | Chandra | 438/328 |
| 7,939,350 | B2 * | 5/2011 | Tsai | 438/28 |
| 7,994,531 | B2 * | 8/2011 | Lin et al. | 257/98 |
| 2006/0001046 | A1 * | 1/2006 | Batres et al. | 257/202 |
| 2006/0003477 | A1 | 1/2006 | Braune et al. | |
| 2006/0157721 | A1 * | 7/2006 | Tran et al. | 257/98 |
| 2007/0001178 | A1 | 1/2007 | Tran et al. | |
| 2007/0222365 | A1 * | 9/2007 | Tamamura | 313/498 |
| 2007/0259509 | A1 * | 11/2007 | Kuo | 438/459 |
| 2008/0179611 | A1 * | 7/2008 | Chitnis et al. | 257/98 |
| 2008/0315228 | A1 | 12/2008 | Krames et al. | |
| 2009/0057701 | A1 | 3/2009 | Chao | |
| 2009/0213294 | A1 * | 8/2009 | Jung et al. | 349/61 |
| 2009/0272996 | A1 | 11/2009 | Chakraborty | |
| 2009/0286335 | A1 | 11/2009 | Le Toquin | |
| 2010/0155750 | A1 | 6/2010 | Donofrio | |
| 2011/0073881 | A1 | 3/2011 | Chakraborty | |

\* cited by examiner

*Primary Examiner* — Ori Nadav
(74) *Attorney, Agent, or Firm* — JW Law Group; James M. Wu

(57) ABSTRACT

System for wafer-level phosphor deposition. A method for phosphor deposition on a semiconductor wafer that has a plurality of LED dies includes the operations of covering the semiconductor wafer with a selected thickness of photo resist material, removing portions of the photo resist material to expose portions of the semiconductor wafer so that electrical contacts associated with the plurality of LED dies remain unexposed, and depositing phosphor on the exposed portions of the semiconductor wafer.

18 Claims, 8 Drawing Sheets

SYSTEM FOR WAFER-LEVEL PHOSPHOR DEPOSITION

BACKGROUND

1. Field

The present application relates generally to light emitting diodes, and more particularly, to a system for wafer-level phosphor deposition.

2. Background

A light emitting diode comprises a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, and is referred to as an n-type or p-type semiconductor region, respectively.

In LED applications, an LED semiconductor chip includes an n-type semiconductor region and a p-type semiconductor region. A reverse electric field is created at the junction between the two regions, which causes the electrons and holes to move away from the junction to form an active region. When a forward voltage sufficient to overcome the reverse electric field is applied across the p-n junction, electrons and holes are forced into the active region and combine. When electrons combine with holes, they fall to lower energy levels and release energy in the form of light. The ability of LED semiconductors to emit light has allowed these semiconductors to be used in a variety of lighting devices. For example, LED semiconductors may be used in general lighting devices for interior applications or in various exterior applications.

During manufacture, a large number of LED semiconductor dies are produced on a semiconductor wafer. For example, the wafer may comprise one hundred or more dies. A process referred to as singulation is used to cut the dies from the wafer. The dies may then be coated with a phosphor coating that controls the color of the light emitted from the die when energized. After coating, the dies are probed and tested for color, light intensity output, power consumption and any other types of operational characteristics.

Unfortunately, coating and testing the dies after singulation may be expensive or complicated and make it difficult to obtain dies having consistent color, light intensity output, or other characteristics.

Accordingly, what is needed is a simple and efficient way to apply a phosphor coating on a semiconductor wafer and perform testing prior to singulation to achieve consistent die characteristics and to avoid the expensive and complicated process of working with individual dies.

SUMMARY

In one or more aspects, a system for wafer-level phosphor deposition is provided to allow phosphor coating and testing to be performed on a semiconductor wafer prior to singulation. Thus, the system simplifies the phosphor deposition process and results in individual LED semiconductor dies having consistent operational parameters.

In an aspect, a method is provided for phosphor deposition on a semiconductor wafer comprising a plurality of LED dies. The method comprises covering the semiconductor wafer with a selected thickness of photo resist material, removing portions of the photo resist material to expose portions of the semiconductor wafer so that electrical contacts associated with the plurality of LED dies remain unexposed, and depositing phosphor on the exposed portions of the semiconductor wafer.

In an aspect, an apparatus is provided for phosphor deposition on a semiconductor wafer comprising a plurality of LED dies. The apparatus comprises means for covering the semiconductor wafer with a selected thickness of photo resist material, means for removing portions of the photo resist material to expose portions of the semiconductor wafer so that electrical contacts associated with the plurality of LED dies remain unexposed, and means for depositing phosphor on the exposed portions of the semiconductor wafer.

In an aspect, an LED die is provided that is prepared by a process comprising the operations of covering a semiconductor wafer comprising the LED die with a selected thickness of photo resist material, removing portions of the photo resist material to expose portions of the semiconductor wafer so that electrical contacts of the LED die remain unexposed, depositing phosphor on the exposed portions of the semiconductor wafer, removing remaining photo resist material to expose the electrical contacts of the LED die, and performing a singulation process to cut the LED die from the semiconductor wafer.

Other aspects will become apparent after review of the hereinafter set forth Brief Description of the Drawings, Description, and the Claims.

BRIEF DESCRIPTION OF THE DRAWINGS

The foregoing aspects described herein will become more readily apparent by reference to the following Description when taken in conjunction with the accompanying drawings wherein.

DESCRIPTION

Figure 1:
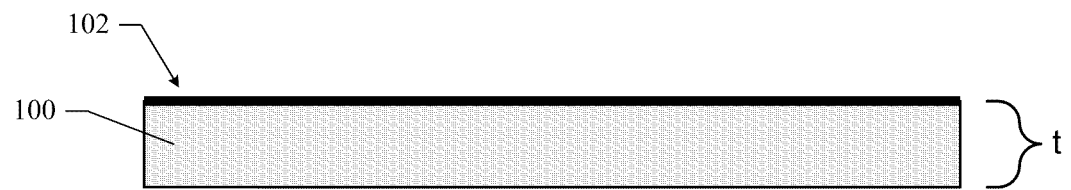
FIG. 1 shows a side view of an exemplary LED semiconductor wafer obtained from a wafer fabrication process.

In various aspects, a system for wafer-level phosphor deposition is provided to allow phosphor coating and testing to be performed on a semiconductor wafer prior to singulation.

The system for wafer-level phosphor deposition is described more fully hereinafter with reference to the accompanying Drawings, in which various embodiments are shown. This invention may, however, be embodied in many different forms and should not be construed as limited to the various aspects presented throughout this disclosure. Rather, these aspects are provided so that this disclosure will be complete enough to provide a thorough understanding of the present invention to those skilled in the art. The various aspects of the present invention illustrated in the drawings may not be drawn to scale. Accordingly, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes may not be intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the Drawings. By way of example, if an apparatus in the Drawings is turned over, elements described as being on the "lower" side of other elements would then be oriented on the "upper" sides of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

FIG. 1 shows a side view of an exemplary LED semiconductor wafer 100 obtained from a wafer fabrication process. For example, in one implementation, the thickness (t) of the LED wafer 100 is approximately 150 micrometers. The wafer 100 comprises any number of LED dies that are exposed on surface 102. For example, the LED wafer 100 may comprise one hundred or more LED dies having associated electrical contacts and light emitting regions formed on the surface 102. During operation, the electrical contacts of each die can be energized to cause light to be emitted from the associated light emitting regions.

Figure 2:
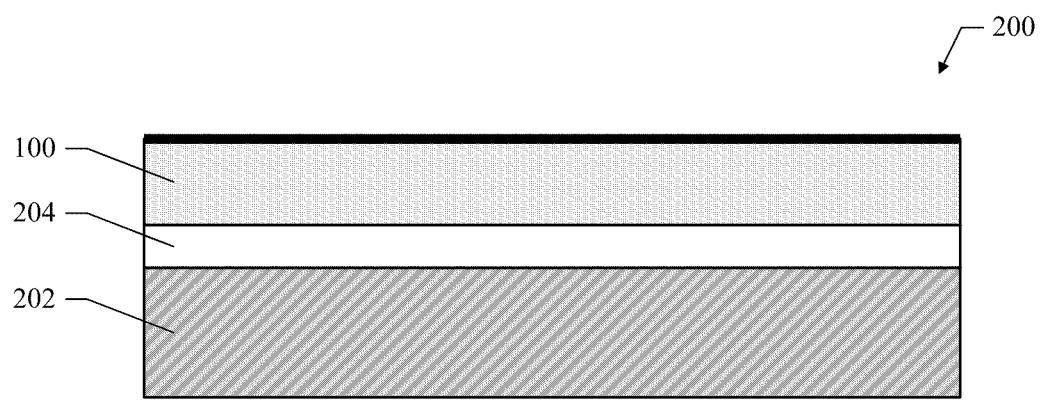
FIG. 2 shows a side view of an exemplary wafer assembly comprising the wafer of FIG. 1 attached to a carrier wafer.

FIG. 2 shows a side view of an exemplary wafer assembly 200 comprising the LED wafer 100 of FIG. 1 attached to a carrier wafer 202. For example, in one implementation, the carrier wafer 202 comprises a sapphire carrier wafer that is attached to the LED wafer 100 with thermal release tape 204. The sapphire carrier wafer 202 operates to support the LED wafer 100 during a phosphor deposition process described below. The thermal release tape allows the sapphire carrier wafer 202 to be easily removed from the LED wafer 100 at a later time. It should be noted that other types of carrier wafers and attachments mechanisms may be used to support the LED wafer 100 during the phosphor deposition process. In one implementation, any suitable automated assembly device is used to assemble the wafer 100 onto the carrier wafer 202 with the thermal release tape 204.

Figure 3:
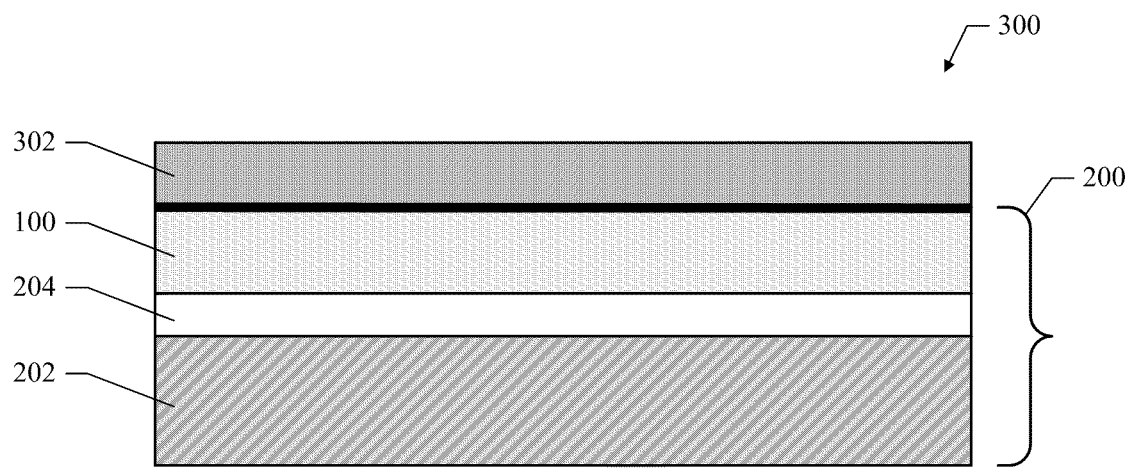
FIG. 3 shows the wafer assembly shown in FIG. 2 and further comprising a photo resist layer.

FIG. 3 shows a side view of a wafer assembly 300 that comprises the wafer assembly 200 and a layer of photo-resist material 302. The photo-resist material 302 is a light sensitive material that becomes soluble to a photo-resist developer after being exposed to light. Any portion of the photo-resist material 302 that is unexposed to light remains insoluble to the photo-resist developer. In one implementation, the photo-resist material 302 is spin coated to form a thick layer on the LED wafer 100. For example, the photo-resist material 302 may be approximately two hundred micrometers thick. It should also be noted that any suitable photo resist deposition device may be used to apply the photo-resist material 302 to the wafer assembly 200.

Figure 4:
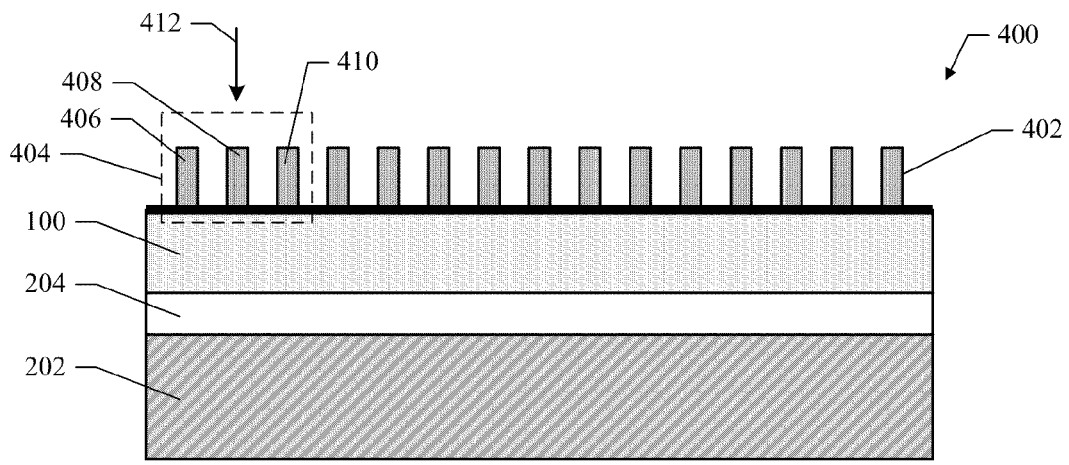
FIG. 4 shows the wafer assembly shown in FIG. 3 after removal of selected portions of the photo resist layer.

FIG. 4 shows a side view of a wafer assembly 400 that comprises the wafer assembly 300 after removal of selected portions of the photo-resist layer 302 using a photolithography process. For example, a photolithography device uses light to transfer a geometric pattern from a photo mask onto the light-sensitive photo-resist layer 302. Light exposed portions of the photo-resist layer 302 are then removed by the photolithography device using a photo-resist developer leaving the unexposed portions remaining. In this example, the unexposed portions are illustrated as photo-resist posts 402.

In one implementation, the posts 402 are approximately two hundred micrometers tall and are located to cover the p and n electrical contact pads of all the LED dies of the LED wafer 100. For example, region 404 comprises three photo-resist posts 406, 408 and 410. A top view of these posts, as indicated at 412, is described in greater detail in FIG. 5.

Figure 5:
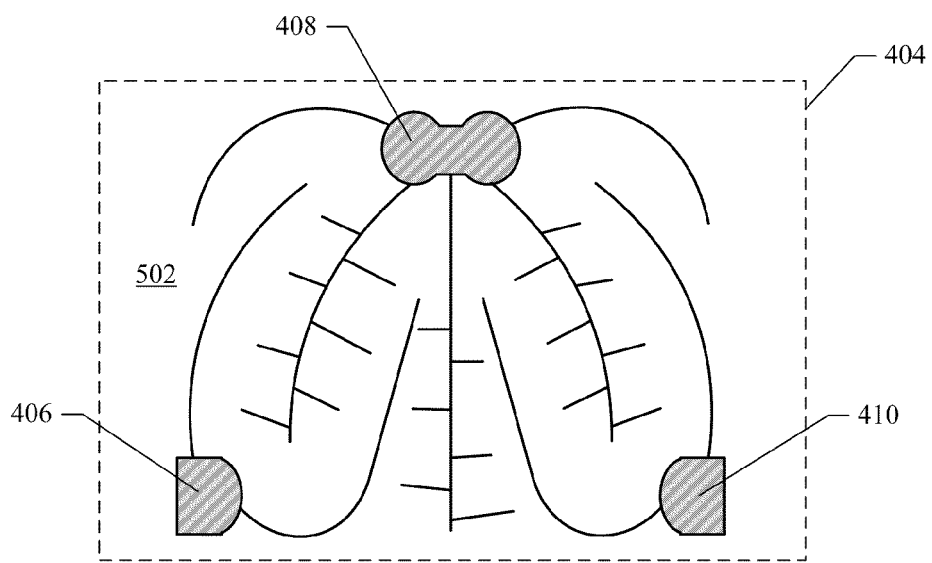
FIG. 5 shows a top view of a portion of the wafer assembly shown in FIG. 4.

FIG. 5 shows a top view of the assembly 400 shown in FIG. 4 and provides a detailed illustration of the region 404 from the perspective of the top view indicator 412. The region 404 comprises the photo-resist posts 406, 408 and 410 that cover the p and n electrical contacts of the LED dies of the LED wafer 100. It should be noted that the photo-resist posts 406, 408, and 410 may comprise any shape or geometry and are not limited to the shapes shown in FIG. 5. By covering the p and n contacts, the photo-resist posts protect these contacts from a phosphor deposition layer to be deposited on the surface 502 of the LED wafer 100. The phosphor deposition operates to control the color of the light emitted by the dies of the LED wafer 100.

Figure 6:
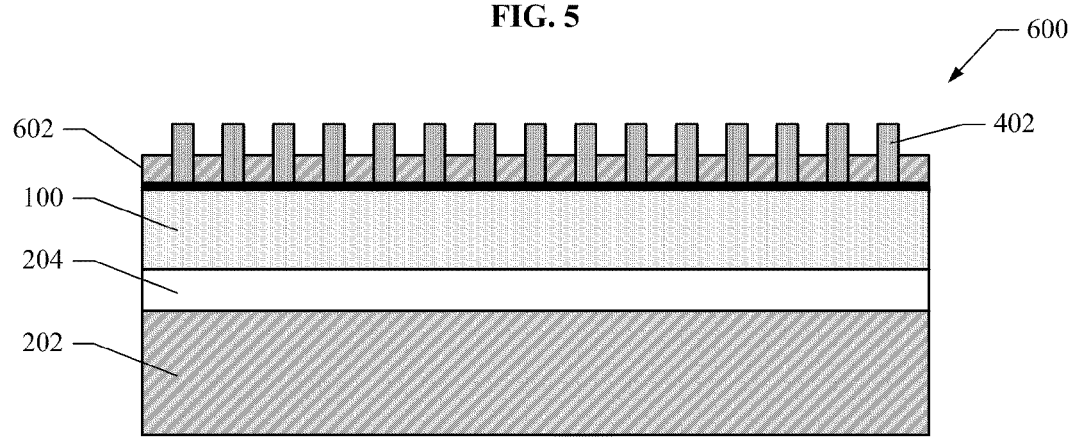
FIG. 6 shows the wafer assembly of FIG. 4 after deposition of a phosphor layer.

FIG. 6 shows a side view of a wafer assembly 600 that comprises the wafer assembly 300 shown in FIG. 4 after deposition of a phosphor layer 602. For example, the phosphor deposition may be performed by a deposition apparatus that utilizes any of the following techniques.

1. Electrophoretic Deposition (EPD)
2. Spin Coating
3. Jetting
4. Droplet Deposition
5. Vacuum Evaporation The phosphor deposition process allows control of the thickness of phosphor layer thereby allowing control of the color of the light emitted from the LED dies. After deposition, the phosphor is allowed to cure. Thus, any suitable phosphor deposition process may be used to apply a phosphor layer having an appropriate thickness onto the wafer assembly 300. Furthermore, any appropriate phosphor material may be used to achieve a resulting light emission having any desired color.

Figure 7:
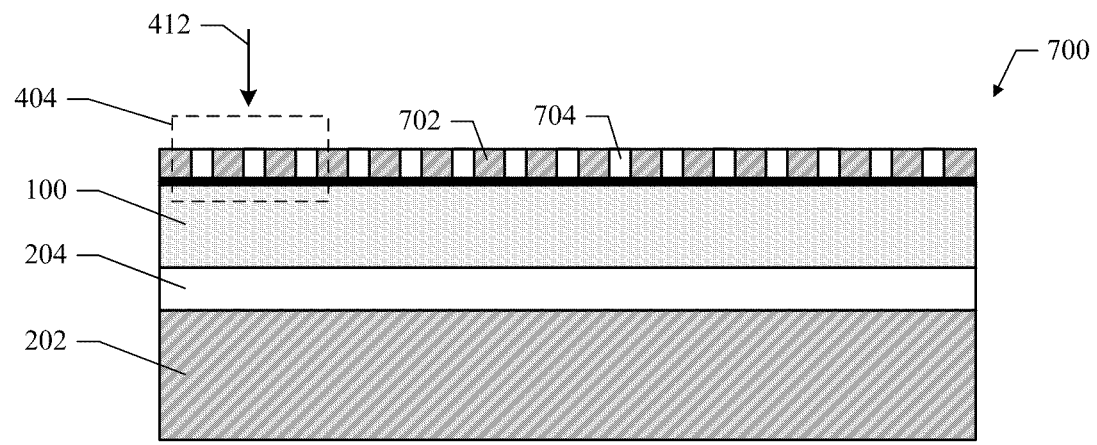
FIG. 7 shows the wafer assembly of FIG. 6 after removal of photo resist posts.

FIG. 7 shows a side view of a wafer assembly 700 that comprises the wafer assembly 600 shown in FIG. 6 after removal of the photo-resist posts 402. For example, in one implementation, the photo-resists posts 402 are removed by the photolithography device by exposing the posts to light and applying the appropriate photo-resist developer. Once the photo-resist posts 402 are removed, the phosphor layer comprises regions of phosphor 702 that cover the surface of the LED wafer 100 and cavities 704 that expose the p and n contacts through the phosphor layer. These cavities 704 allow wire bonding of the exposed contacts.

Figure 8:
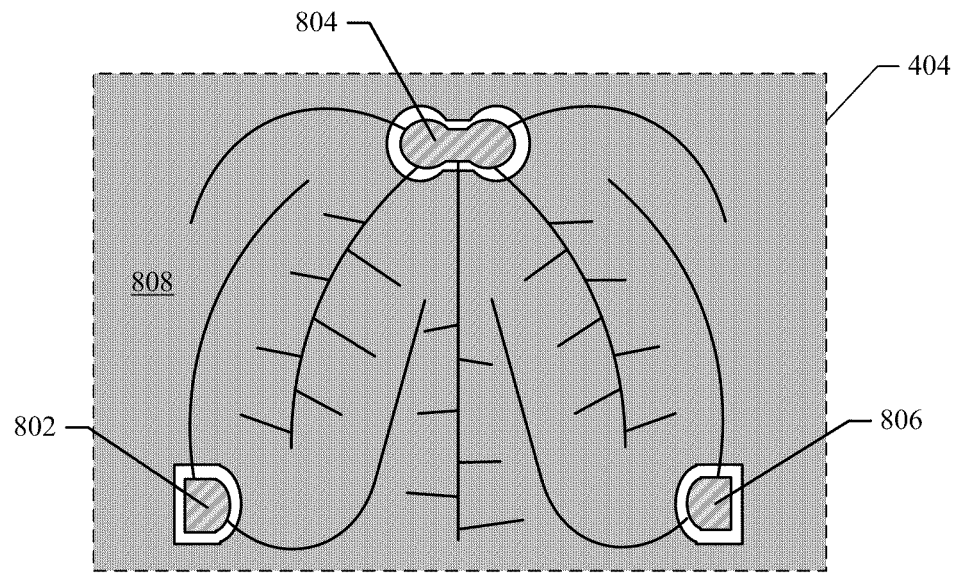
FIG. 8 shows a top view of a portion of the wafer assembly of FIG. 7.

FIG. 8 shows a top view of the assembly 700 shown in FIG. 7 and provides a detailed illustration of the region 404 from the perspective of the top view indicator 412. The top view shown in FIG. 8 provides a detailed illustration of the region 404 after removal of the photo-resist posts 406, 408 and 410. Once the photo-resists posts are removed the p and n contacts underneath the posts are exposed. For example, removal of the posts 406, 408 and 410 exposes the contacts 802, 804 and 806, respectively. Also shown is the semiconductor surface which is now covered by the phosphor deposition 808.

Figure 9:
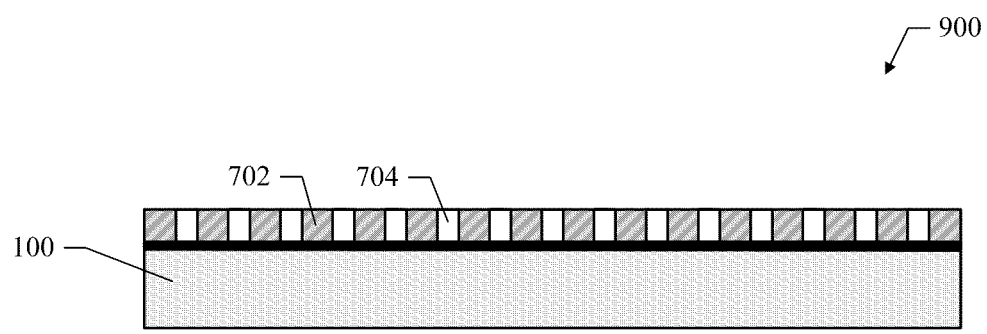
FIG. 9 shows the wafer assembly of FIG. 7 after removal of a carrier wafer.

FIG. 9 shows a wafer assembly 900 that comprises the wafer assembly 700 of FIG. 7 after removal of the carrier wafer. For example, the thermal release tape 204 is heated to release the sapphire carrier wafer 202 so that the LED wafer 100 with phosphor deposition 702 remains.

Figure 10:
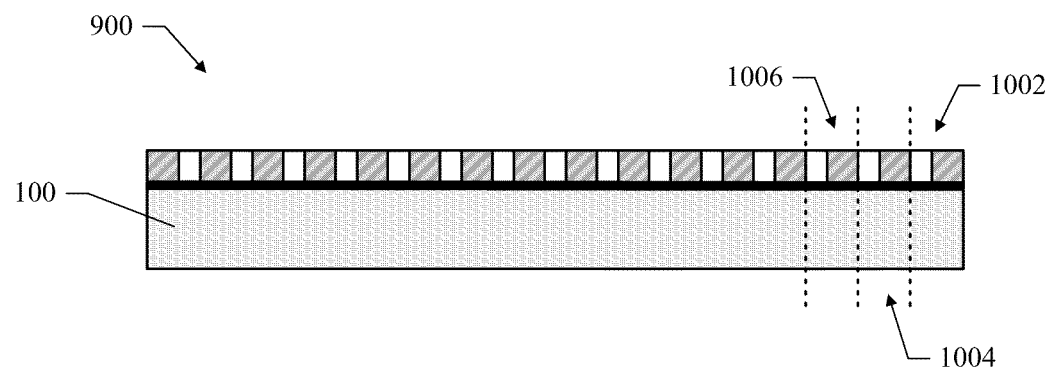
FIG. 10 shows a singulation process performed on the wafer assembly of FIG. 7 to obtain individual LED semiconductor dies.

FIG. 10 shows a singulation process performed on the wafer assembly 900. The singulation process operates to divide the LED wafer assembly 900 into individual dies. In one implementation, singulation is performed using a front-side laser scribing and breaking device that divides the LED wafer assembly 900 into individual dies (i.e., 1002, 1004, and 1006).

Figure 11:
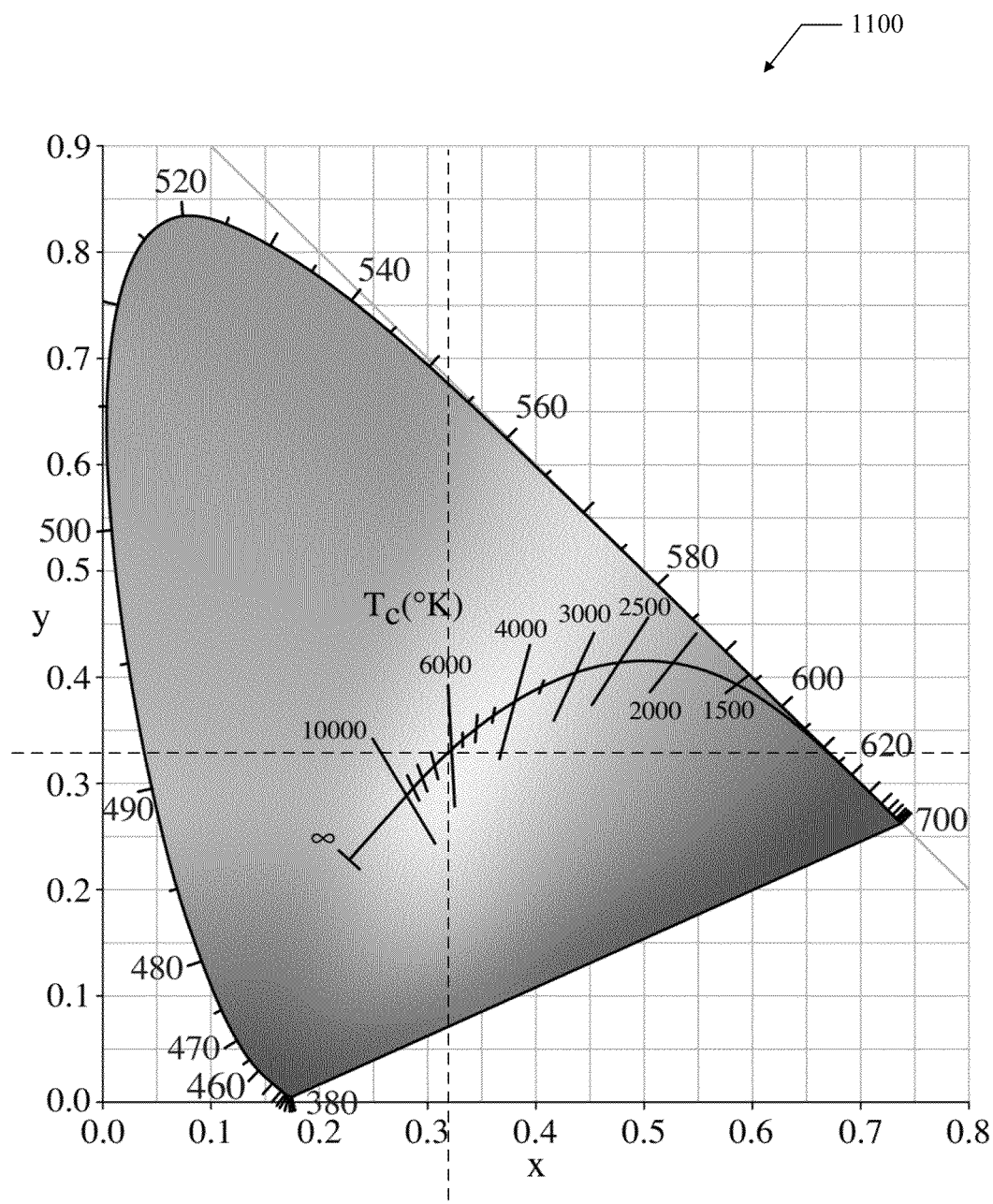
FIG. 11 shows an exemplary color chart that associates X and Y values with color temperature.

FIG. 11 shows an exemplary color chart 1100 that associates two parameters (X and Y) with color temperature. For example, the color chart 1100 provides X values along the horizontal axis and Y values along the vertical axis. Thus, as indicated by the dashed lines, an X value of 0.32 and a Y value of 0.33 correspond to a color temperature of approximately 6000 Kelvin (K). The color chart 1100 provides a mechanism by which the X and Y values can be used to accurately identify particular colors for the purpose of binning and sorting dies.

In one implementation, the wafer 900 shown in FIG. 9 is probed and tested by a computerized probing device for the purpose of associating X and Y values with each die. Probing the entire wafer at the same time is more efficient than probing individual dies after singulation. During the probing process, each die is energized and various die characteristics are determined. For example, the probing device includes contacts points that are positioned to touch the electrical contacts of each die of the wafer 900. The electrical contacts are exposed and accessible through the cavities 704 in the phosphor deposition. Once the dies are energized, the probing device measures color temperature, lumen output, voltage, current, and any other operating parameters associated with each die. In an aspect, the measured parameters for each die are mapped to X and Y values based on the color chart 1100. Thus, each die is associated with it own X and Y values prior to singulation.

Figure 12:
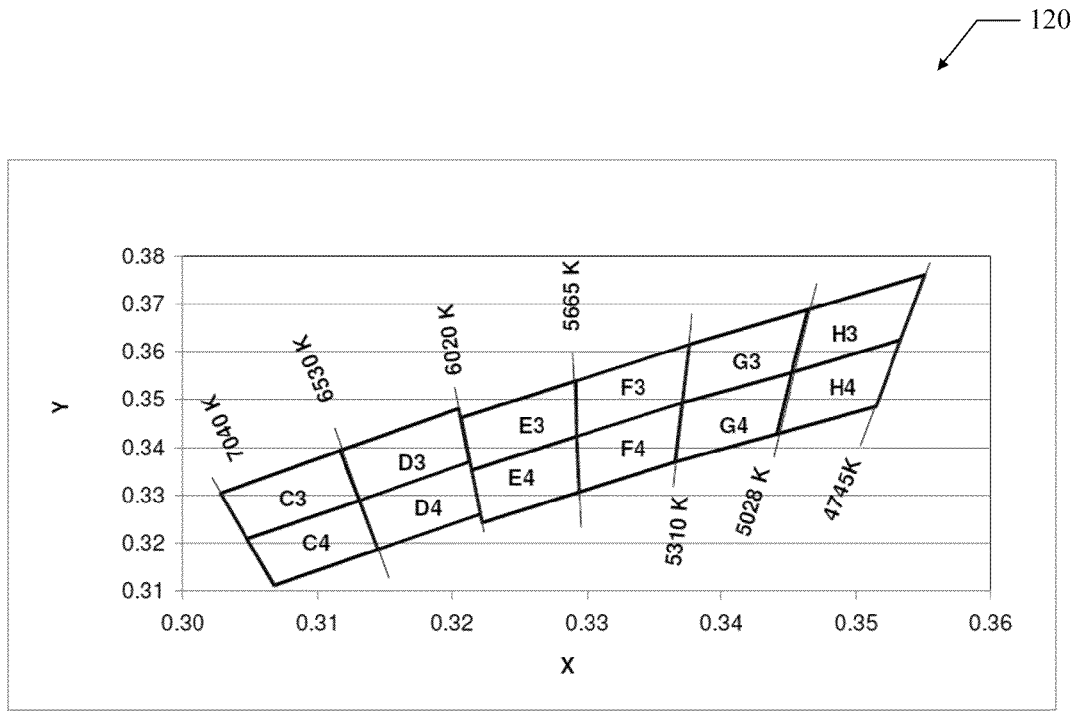
FIG. 12 shows an exemplary color binning graph and table used for sorting and binning LED dies.

FIG. 12 shows a graph 1200 and associated binning table 1202 that can be used to sort and bin LED dies prior to singulation. For example, the graph 1200 defines a number of bins which each include a range of X and Y values from the color chart 1100 of FIG. 11. In this example, the bin D4 includes the X value of 0.32 and the Y value of 0.33.

Referring now to the binning table 1202, a numerical arrangement is shown. For example, the bin D4, shown at 1204, is associated with a range of X and Y values that include 0.32 and 0.33, respectively. The ANSI color temperature of this range is also shown.

Thus, as each die is separate from the wafer during the singulation process, its associated X and Y value can be used to sort it into the appropriate bin using the binning table 1202. The dies in each bin can then be place on a tape or packaged using any other packaging method, so that the resulting group of dies will have excellent color consistency. For example, in one implementation, the dies are binned and sorted by a computerized binning device that knows the X and Y values associated with each die.

Figure 13:
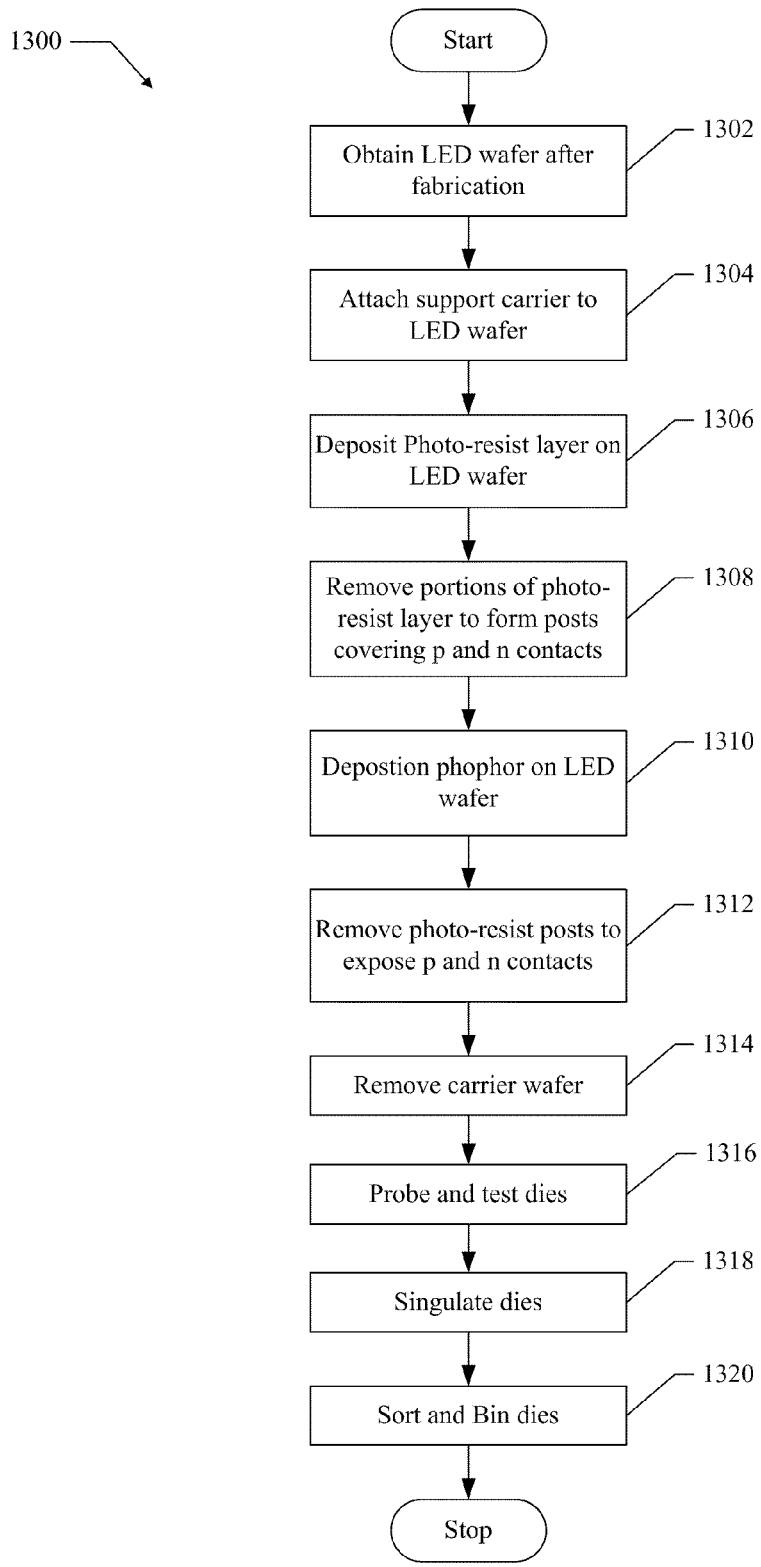
FIG. 13 shows an exemplary method for performing wafer-level phosphor deposition.

FIG. 13 shows a method for performing wafer-level phosphor deposition in accordance with the present invention. For example, the method 1300 can be used to perform phosphor deposition as described above with respect to the wafer 100.

At block 1302, a LED wafer is obtained from a fabrication process. For example, the wafer 100 is obtained for the wafer-level phosphor deposition process. In one implementation, the wafer 100 comprises one hundred or more LED dies.

At block 1304, a support carrier is attached to the LED wafer. For example, the sapphire support carrier 202 is attached to the LED wafer using thermal release tape 204. The support carrier operates to support the LED wafer during the wafer-level phosphor deposition process. In an implementation, any suitable automated assembly device is used to assemble the wafer 100 onto the carrier wafer 202 with the thermal release tape 204.

At block 1306, a photo-resist layer is applied to the LED wafer. In one implementation, the photo-resist layer is applied using a spin coating process. For example, the photo-resist layer is applied to the LED wafer 100 and is approximately two hundred micrometers thick. In an implementation, any suitable photo resist deposition device may be used to apply the photo-resist material 302 to the wafer assembly 200.

At block 1308, portions of the photo-resist layer are removed so that photo resist posts cover p and n contacts of the LED wafer. For example, as illustrated in FIG. 4, a photolithography device uses light to transfer a geometric pattern from a photo mask to the light-sensitive photo-resist layer. Light exposed portions of the photo-resist layer are then removed using a photo-resist developer leaving the unexposed portions remaining. The unexposed portions remain as photo-resist posts 402. FIG. 5 shows a top view that illustrates how the photo-resist posts cover the p and n contacts of the LED wafer.

At block 1310, phosphor is deposited on the surface of the LED wafer. As illustrated in FIG. 6, phosphor is disposed on the surface of the LED wafer and surrounds the photo resist posts 402. For example, a deposition apparatus applies the phosphor to the surface of the LED wafer using at least one of a spin coating, EPD, and jetting process.

At block 1312, the photo-resist posts are removed exposing the p and n contacts. For example, in one implementation, the photo-resists posts 402 are removed by exposing them to light and applying the appropriate photo-resist developer. Once the photo-resist posts 402 are removed, the phosphor layer comprises regions of phosphor 702 that cover the surface of the LED wafer 100 and cavities 704 that expose the p and n contacts through the phosphor layer.

At block 1314, the carrier wafer is removed. For example, the thermal release tape is heated to release the sapphire carrier wafer. In an implementation, any suitable automated assembly device is used to disassemble the wafer 100 from the carrier wafer 202.

At block 1316, the wafer is probed and tested to determine color temperature, lumen output, power consumption and any other LED characteristics. In addition, the measured color temperature of each die is associated with X and Y values according to the color chart 1100. In an implementation, the wafer is probed and tested by a computerized probing device.

At block 1318, a singulation process is performed to divide or cut the LED wafer into individual dies. In one implementation, singulation is performed using a front-side laser scribing and breaking process to divide the LED wafer 900 into individual dies. In one implementation, singulation is performed using a front-side laser scribing and breaking device that divides the LED wafer assembly 900 into individual dies.

At block 1320, the dies are sorted and binned. For example, the X and Y values determined during the probing and testing process at block 1316 are used to bin the dies according to the bin plot 1200 and the bin table 1202. For example, the bin plot 1200 defines one or more bins associated with X and Y values. The bins are further defined in the bin table 1202. The X and Y value of each die is cross-referenced in the bin table 1202 to determine the bin number in which the die is to be grouped. For example, in one implementation, the dies are binned and sorted by a computerized binning device that knows the X and Y values associated with each die.

Therefore, the method 1300 operates to perform wafer-level phosphor deposition in accordance with the present invention. It should be noted that the method 1300 is just one implementation and that the operations of the method 1300 may be rearranged or otherwise modified within the scope of the various aspects. Thus, other implementations are possible with the scope of the various aspects described.

Figure 14:
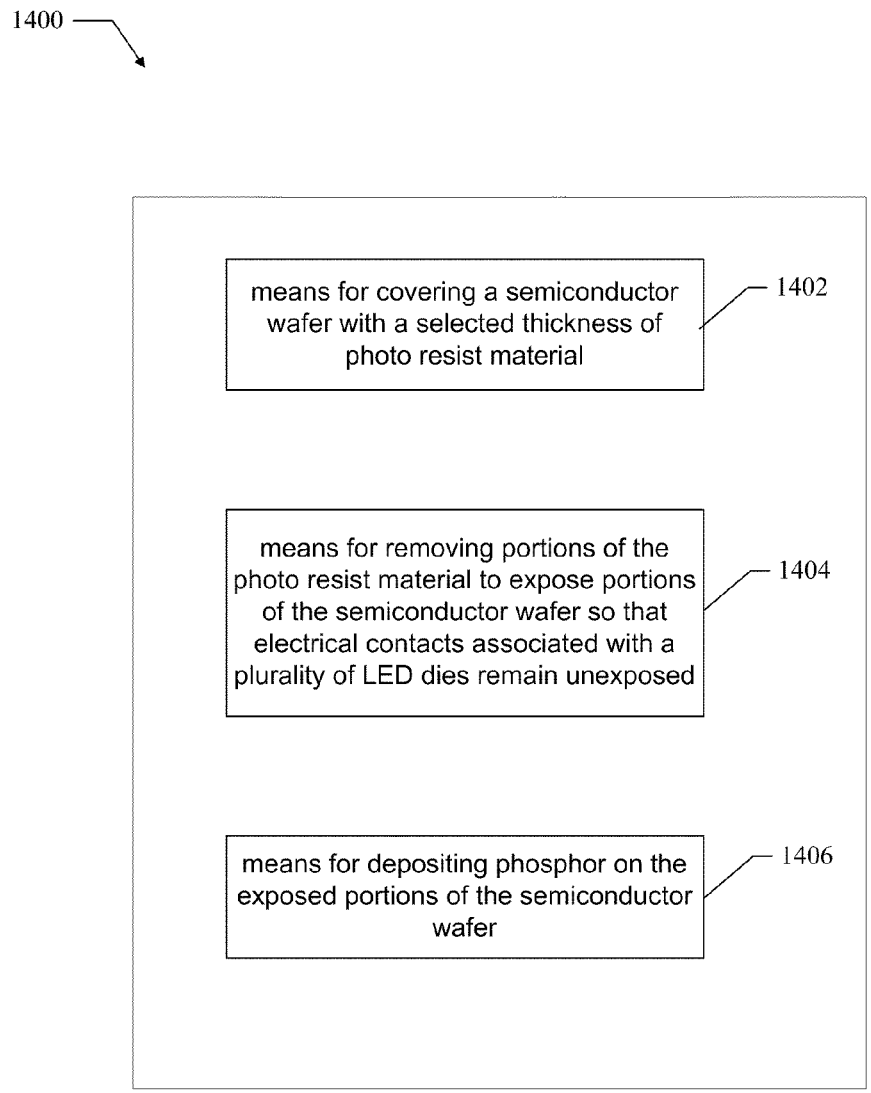
FIG. 14 shows an exemplary apparatus for performing wafer-level phosphor deposition.

FIG. 14 shows an exemplary apparatus 1400 for performing wafer-level phosphor deposition. For example, the apparatus 1400 is suitable for use to produce the semiconductor wafer 600 shown in FIG. 6. In an aspect, the apparatus 1400 is implemented by one or more modules configured to provide the functions as described herein. For example, in an aspect, each module comprises hardware and/or hardware executing software.

The apparatus 1400 comprises a first module comprising means (1402) for covering a semiconductor wafer with a selected thickness of photo resist material, which in an aspect comprises a photo resist deposition device.

The apparatus 1400 also comprises a second module comprising means (1404) for means for removing portions of the photo resist material to expose portions of the semiconductor wafer so that electrical contacts associated with the plurality of LED dies remain unexposed, which in an aspect comprises a photolithography device.

The apparatus 1400 comprises a third module comprising means (1406) for means for depositing phosphor on the exposed portions of the semiconductor wafer, which in as aspect comprises a phosphor deposition apparatus.

The description of the disclosed aspects is provided to enable any person skilled in the art to make or use the present invention. Various modifications to these aspects may be readily apparent to those skilled in the art, and the generic principles defined herein may be applied to other aspects, without departing from the spirit or scope of the invention. Thus, the present invention is not intended to be limited to the aspects shown herein but is to be accorded the widest scope consistent with the principles and novel features disclosed herein. The word "exemplary" is used exclusively herein to mean "serving as an example, instance, or illustration." Any aspect described herein as "exemplary" is not necessarily to be construed as preferred or advantageous over other aspects.

Accordingly, while aspects of a system for wafer-level phosphor deposition have been illustrated and described herein, it will be appreciated that various changes can be made to the aspects without departing from their spirit or essential characteristics. Therefore, the disclosures and descriptions herein are intended to be illustrative, but not limiting, of the scope of the invention, which is set forth in the following claims.

What is claimed is:

1. A method for phosphor deposition on a semiconductor wafer, the method comprising:

depositing a semiconductor wafer having a plurality of light emitting diode ("LED") dies on a carrier wafer;

covering a first surface of the semiconductor wafer with a photo resist material layer having a first height;

removing at least a portion of the photo resist material layer to expose at least a portion of the semiconductor wafer and preserving remaining photo resist material layer to form a plurality of posts having the first height covering electrical contacts associated with the plurality of LED dies from exposure, wherein preserving remaining photo resist material layer to form a plurality of posts includes substantially aligning bottom surfaces of the plurality of posts in a first plain, wherein no post has a bottom surface in a plain different than the first plain;

depositing a phosphor layer with a substantial uniform thickness having a second height only on the exposed portions of the semiconductor wafer and allowing the second height of phosphor layer to be lower than the first height of the plurality of posts, and allowing a portion of the phosphor layer to contact at least part of circumference of one of the plurality of posts, wherein depositing the phosphor layer includes allowing bottom surface of the phosphor layer to be substantially aligned; and removing the remaining photo resist material after depositing the phosphor to expose the electrical contacts.

2. The method of claim 1, further comprising performing a singulation process to cut the plurality of LED dies from the semiconductor wafer to form individual dies.

3. The method of claim 1, further comprising probing the electrical contacts to determine a plurality of color temperatures associated with the plurality of LED dies, respectively.

4. The method of claim 3, further comprising mapping the plurality of color temperatures to X and Y values associated with a color chart.

5. The method of claim 4, further comprising performing a singulation process to cut the plurality of LED dies from the semiconductor wafer to form individual dies each having an associated X and Y value.

6. The method of claim 5, further comprising:
identifying one or more bins in a binning table, wherein each bin comprises a range of X and Y values; and
sorting the individual dies based on their associated X and Y values according to the binning table.

7. The method of claim 1, further comprising attaching a carrier wafer to support the semiconductor wafer.

8. The method of claim 7, wherein attaching a carrier wafer to support the semiconductor wafer includes applying a thermal release tape between the carrier wafer and the semiconductor wafer.

9. The method of claim 8, wherein removing the carrier wafer includes heating the thermal release tape to separate the carrier wafer from the semiconductor wafer.

10. The method of claim 7, wherein the carrier wafer includes sapphire wafer.

11. A method for depositing a phosphor layer comprising:
depositing a semiconductor wafer containing a plurality of light emitting diode ("LED") dies on a carrier wafer;
depositing a photo resist material layer having a first height over the semiconductor wafer;
removing portions of the photo resist material layer to expose portions of the semiconductor wafer and allowing remaining portion of the photo resist material layer to form at least one post with the first height covering over an electrical contact associated with one of the plurality of LED dies, wherein allowing remaining portion of the photo resist material layer includes substantially aligning bottom surface of the remaining portion of the photo resist material layer in a first plan, wherein no remaining portion of the photo resist material layer has a bottom surface in a plain different than the first plain;
depositing a phosphor layer with a substantial uniform thickness having a second height only on the exposed portions of the semiconductor wafer, wherein depositing the phosphor layer includes substantially aligning bottom surface of the phosphor layer;
allowing at least a portion of the phosphor layer to contact at least part of circumference of one of the plurality of posts and allowing the first height of the photo resist material layer to be higher than the second height of the phosphor layer so that the phosphor layer forms around the post; and
removing the remaining portion of the photo resist material to expose the electrical contacts.

12. The method of claim 11, further comprising energizing each of the plurality of LED dies in the semiconductor wafer to determine a color temperature.

13. The method of claim 12, further comprising mapping the color temperature with color temperature chart of the plurality of LED dies.

14. The method of claim 13, further comprising identifying number of bins arranged in X and Y values of a color temperature chart.

15. The method of claim 14, further comprising sorting the plurality of the LED dies into different bins in accordance with X and Y values during a wafer singulation process.

16. The method of claim 15, wherein sorting the plurality of the LED dies into different bins includes performing a dicing process to separate the plurality of LED dies from the semiconductor wafer.

17. The method of claim 11, further comprising performing a singulation process to separate the plurality of LED dies from the semiconductor wafer to form individual dies.

18. The method of claim 11, wherein allowing the predefined first thickness of photo resist material to be thicker than the predefined second thickness of the phosphor layer includes forming the post having a range of thickness between 100 and 500 micrometers.

* * * * *